United States Patent
Nguyen et al.

(10) Patent No.: US 9,014,322 B2
(45) Date of Patent: Apr. 21, 2015

(54) LOW POWER AND COMPACT AREA DIGITAL INTEGRATOR FOR A DIGITAL PHASE DETECTOR

(71) Applicant: Finisar Corporation, Sunnyvale, CA (US)

(72) Inventors: The'Linh Nguyen, San Jose, CA (US); Steven Gregory Troyer, Savoy, CA (US); Daniel K. Case, Gilroy, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 13/757,665

(22) Filed: Feb. 1, 2013

(65) Prior Publication Data

US 2013/0315349 A1 Nov. 28, 2013

Related U.S. Application Data

(60) Provisional application No. 61/650,837, filed on May 23, 2012.

(51) Int. Cl.
*H03D 3/24* (2006.01)
*H04L 7/00* (2006.01)
*H04L 7/033* (2006.01)
*H03L 7/093* (2006.01)

(52) U.S. Cl.
CPC .............. *H04L 7/0016* (2013.01); *H04L 7/033* (2013.01); *H03L 7/093* (2013.01)

(58) Field of Classification Search
USPC .................................. 375/376, 373, 371, 354
See application file for complete search history.

(56) References Cited

U.S. PATENT DOCUMENTS

| | | | |
|---|---|---|---|
| 7,421,050 B2 | 9/2008 | Aziz et al. | |
| 2006/0164173 A1 | 7/2006 | Klein et al. | |
| 2008/0258835 A1 | 10/2008 | Galloway et al. | |
| 2009/0015338 A1* | 1/2009 | Frey | 331/16 |
| 2010/0067636 A1 | 3/2010 | Bae et al. | |
| 2011/0133794 A1 | 6/2011 | Dunworth et al. | |
| 2011/0133799 A1* | 6/2011 | Dunworth et al. | 327/157 |
| 2013/0015896 A1* | 1/2013 | Li | 327/156 |

FOREIGN PATENT DOCUMENTS

WO 0133828 5/2001

OTHER PUBLICATIONS

P.K. Hanumolu, et al., "A 1.6 Gbps Digital CDR." IEEE Custom Integrated Circuits Conference (2006) 603-606.

(Continued)

*Primary Examiner* — Zewdu Kassa
(74) *Attorney, Agent, or Firm* — Maschoff Brennan

(57) ABSTRACT

In an example embodiment, a phase-locked loop circuit may include a first circuitry to receive a reference signal and a source signal. The first circuitry may generate a correction signal for demonstrating a difference in phase between the reference signal and the source signal. The phase-locked loop may include a second circuitry to receive the correction signal. The second circuitry may generate a digital signal for demonstrating a phase-to-digital conversion of the correction signal. The phase-locked loop may include a third circuitry to receive the digital signal. The third circuitry may generate a control signal for demonstrating a converted voltage of the digital signal. The phase-locked loop may include a fourth circuitry to receive the control signal. The fourth circuitry may generate the source signal in response to the control signal.

17 Claims, 5 Drawing Sheets

(56) References Cited

OTHER PUBLICATIONS

Texas Instruments Incorporated, Implementation of 12-bit delta-sigma DAC with MSC12xx controller, Analog Applications Journal 1Q 2002, 27-32.

Perrott, M.H., et al., "A 2.5Gb/s Multi-Rate 0.25-μm CMOS CDR Utilizing a Hybrid Analog/Digital Loop Filter and All-Digital Referenceless Frequency Acquisition," Solid-State Circuits, IEEE Journal of, vol. 41, No. 12, pp. 2930-2944, Dec. 2006.

International Search Report and Written Opinion mailed Aug. 23, 2013 in related PCT Application No. PCT/US2013/041708.

* cited by examiner

LOW POWER AND COMPACT AREA DIGITAL INTEGRATOR FOR A DIGITAL PHASE DETECTOR

CROSS-REFERENCE TO RELATED APPLICATIONS

This application claims priority to U.S. Provisional Patent Application No. 61/650,837, filed May 23, 2012, titled "Phase-Locked Loop," which is incorporated herein by reference in its entirety.

BACKGROUND OF THE INVENTION

1. The Field of the Invention

The present invention may relate to phase-locked loop systems.

2. The Relevant Technology

A phase-locked loop system is a control system configured to generate a source signal having a fixed phase relationship to a reference signal. Phase-locked loops are widely used in radio, telecommunications, computers, and other electronic applications. Phase-locked loops may be used in a number of applications, including clock and data recovery (CDR) circuits. For example, in some systems, data may be transmitted to a receiver without additional timing reference and the timing information may be recovered at the receiver using a CDR circuit.

FIG. 1 illustrates an example of a conventional analog phase-locked loop 100. The phase-locked loop 100 may input a reference signal 102 and output a source signal 104. The phase of the output source signal 104 may be related to the phase of the reference signal 102.

The phase-locked loop 100 may include a phase detector 106. The phase detector 106 may receive as an input the reference signal 102 and the source signal 104 and produce a correction signal 110 indicating the phase difference of the reference signal 102 and the source signal 104. A number of phase detector designs may be available for generating a correction signal 110. Phase detectors are usually characterized as linear and nonlinear. A linear phase detector has output signal that is proportional to the difference in the phase relationship between the reference signal 102 and the source signal 104. A nonlinear phase detector has no such proportionality and usually has two states: early or late. A nonlinear phase detector is also known as a digital phase detector. The correction signal 110 may be filtered by a loop filter 112 to generate a control signal 114. The loop filter 112 may include a low-pass filter to attenuate high-frequency portions of the correction signal 110. This low-pass filter is commonly implemented in the form of an integrator with a compensating zero. The integrator with a compensating zero is usually implemented with a charge pump circuit and a series resistor-capacitor. The required capacitance is typically very large (much greater than 1 nF) so it is usually an external component, making it difficult to introduce the integrator with a compensating zero into integrated circuit (IC) technologies.

The phase-locked loop 100 may include a voltage-controlled oscillator 116. The voltage-controlled oscillator 116 may generally be configured to output an oscillating signal, for example, the source signal 104. The frequency of the oscillating signal may be dependent on the voltage input by the voltage-controlled oscillator 116. The control signal 114 may drive a voltage-controlled oscillator 116 to generate the source signal 104 with a periodic oscillation. The frequency of the source signal 104 may be controlled by the voltage of the control signal 114.

If the source signal 104 and the reference signal 102 are phase matched, the voltage of the control signal 114, and thus, the frequency of the source signal 104 may remain unchanged. If the phase of the source signal 104 falls behind the phase of the reference signal 102, the phase detector 106 may generate a correction signal 110 such that a resulting control signal 114 causes the voltage-controlled oscillator 116 to speed up the frequency of the source signal 104. For example, the voltage of the control signal 114 may increase. Conversely, if the phase of the source signal 104 moves ahead of the reference signal 102, the phase detector 106 may generate the correction signal 110 such that the control signal 114 causes the voltage-controlled oscillator 116 to slow down the frequency of the source signal 104. For example, the voltage of the control signal 114 may decrease.

In some systems, the source signal 104 and the reference signal 102 may lose the ability to phase lock if the reference frequency is too high or too low. For example, the source signal 104 and the reference signal 102 may lose the ability to phase lock if the voltage required to produce a frequency match is unattainable by the system. In some systems, if the phase-locked loop 100 is unable to achieve a lock, the voltage of the control signal 114 may be driven near a supply voltage or a ground voltage of the system. In some systems, a window comparator may monitor the voltage of the control signal 114 during the frequency acquiring phase of the loop. If the final-converged voltage of the control signal 114 is below a high threshold and above a low threshold, the window comparator may output a signal indicating that the source signal 104 is locked in frequency to the reference signal 102 in a proper range as to guarantee lock over all environmental conditions for which the CDR was designed. The high threshold may be based on the supply voltage and the low threshold may be based on the ground voltage. If the voltage of the control signal 114 is above the high threshold or below the low threshold, the window comparator may output a signal indicating that the source signal 104 is not locked in frequency to the reference signal 102.

In some applications, the source signal 104 may be used to determine a timing reference (clock) of a reference signal 102. For example, in some communication systems, data may be transmitted to a receiver without additional clock information. For example, in some optical communication systems, data may be transmitted over optical fibers to be received at receivers without accompanying clock information. In some embodiments, the phase-locked loop 100 may be used to derive clock information from the received data, commonly known as CDR.

The conventional CDR also requires a loop filter as shown in FIG. 1. It will also require large capacitance such that it would be very difficult to integrate that component in modern IC technologies.

FIG. 2 illustrates a conventional digital phase-locked loop 200 including a digital filter 206. The correction signal 110 is converted to a digital correction signal 202 by the analog-to-digital converter 204. The digital correction signal 202 may be processed by the digital filter 206 using digital signal processing techniques to obtain the equivalent filtering of the loop filter 112 as described with reference to FIG. 1. The digital filter output 208 may be converted to an analog signal 210 by a digital-to-analog converter 212. Alternately, the digital filter output 208 may drive a digitally-controlled oscillator (not shown) directly.

The embodiments described in this document describe systems and methods of digitizing the output of a digital phase detector that result in very low power and compact size suitable for high level of integration using modern IC technologies.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments may include a phase-locked loop circuit for receiving a reference signal including a reference phase and generating a source signal including a source phase related to the reference phase. The phase-locked loop may include a first circuitry configured to receive the reference signal and the source signal. The first circuitry may be further configured to generate a correction signal for demonstrating a difference in phase between the reference signal and the source signal. The phase-locked loop may further include a second circuitry configured to receive the correction signal. The second circuitry may be further configured to generate a digital signal for demonstrating a phase-to-digital conversion of the correction signal. The phase-locked loop may further include a third circuitry configured to receive the digital signal. The third circuitry may be further configured to generate a control signal for demonstrating a converted value of the digital signal. The phase-locked loop may further include a fourth circuitry configured to receive the control signal. The fourth circuitry may be further configured to generate the source signal in response to the control signal.

Some embodiments may include a method of generating a source signal from a reference signal including a reference phase. The source signal may include a source phase related to the reference phase. The method may include receiving the reference signal and the source signal. The method may further include generating a correction signal communicating a difference in phase between the reference signal and the source signal. The method may further include generating a digital signal communicating a phase-to-digital conversion of the correction signal. The method may further include generating a control signal communicating a converted value of the digital signal. The method may further include generating the source signal in response to the control signal.

Some embodiments may include a phase-locked loop circuit for receiving a reference signal including a reference phase and generating a source signal including a source phase related to the reference phase. The phase-locked loop circuit may include means for generating a correction signal for communicating a difference in phase between the reference signal and the source signal. The phase-locked loop circuit may further include means for generating a digital signal for communicating phase-to-digital conversion of the correction signal. The phase-locked loop circuit may further include means for generating a control signal for communicating a converted value of the digital signal. The phase-locked loop circuit may further include means for generating the source signal in response to the control signal.

The embodiments described herein describe systems and methods of digitizing the output of a digital phase detector in a manner that results in very low power dissipation and a compact size suitable for a high level of integration using modern IC technologies. The output of a digital phase detector is a digital signal and hence can be processed with a digital filter. However, at high bit rate the digital signal is usually running at the line rate, so the signal may be decimated and down sampled to a reasonable clock rate prior to processing. Embodiments described herein disclose the use of a sigma-delta modulator as a decimator and down-sampler for digital phase detectors.

Additional features and advantages of the embodiments will be set forth in the description which follows, and in part will be obvious from the description, or may be learned by the practice of the embodiments. The features and advantages of the embodiments may be realized and obtained by means of the instruments and combinations particularly pointed out in the appended claims. These and other features of the present embodiments will become more fully apparent from the following description and appended claims, or may be learned by the practice of the embodiments as set forth hereinafter.

BRIEF DESCRIPTION OF THE DRAWINGS

To further clarify the above and other advantages and features of the present embodiments, a more particular description of the embodiments will be rendered by reference to specific embodiments thereof which are illustrated in the appended drawings. It is appreciated that these drawings depict only typical embodiments of the invention and are therefore not to be considered limiting of its scope. The embodiments will be described and explained with additional specificity and detail through the use of the accompanying drawings in which.

DETAILED DESCRIPTION OF THE PREFERRED EMBODIMENTS

Embodiments may relate to phase-locked loop systems.

Figure 1:
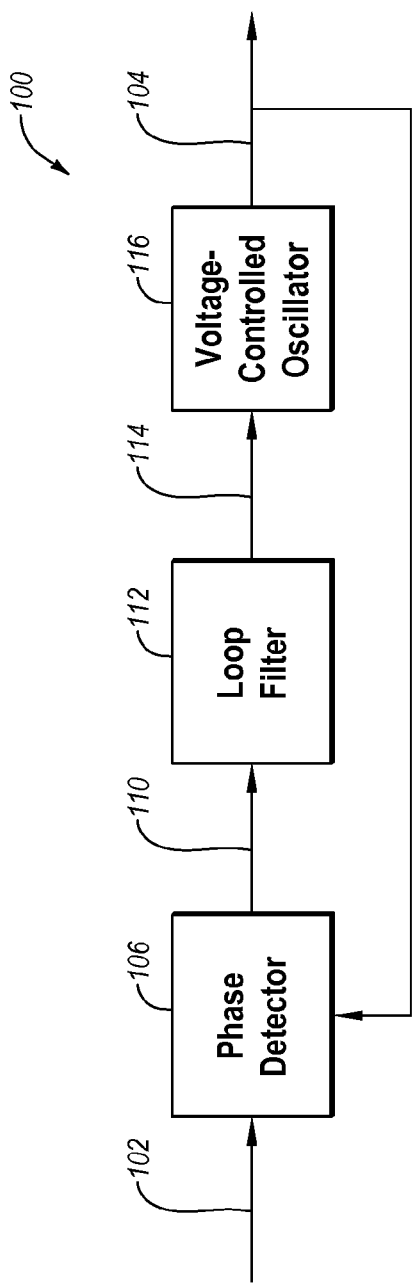
FIG. 1 illustrates an example of a conventional analog phase-locked loop.
Figure 2:
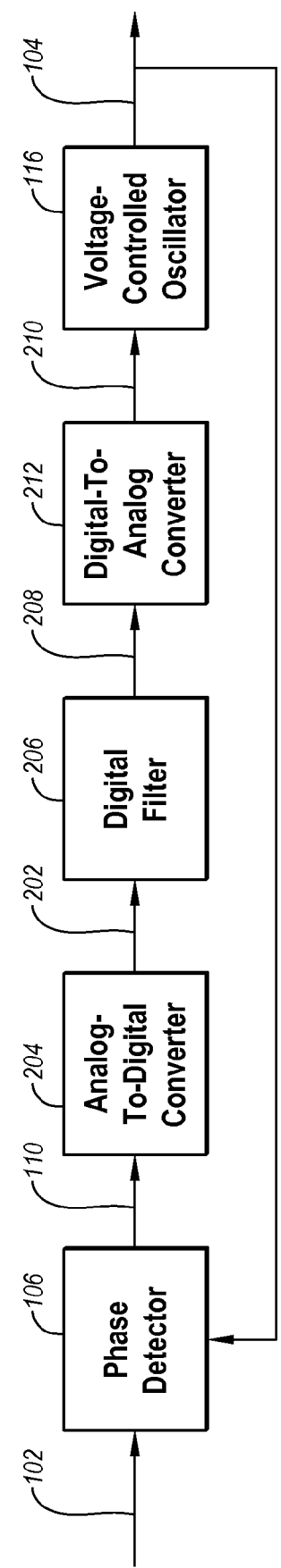
FIG. 2 illustrates an example of a conventional digital phase-locked loop.

The conventional digital phase-locked loop illustrated in FIG. 2 allows the digital filter 206 to be implemented without external components, an advantage when compared to the conventional analog phase-locked loop 100 illustrated in FIG. 1. The architecture described with reference to FIG. 2 requires components such as adders and DAC that operate at very high clock rate. Operating adders and DAC at a high clock rate may translate to high power dissipation. Solutions have been designed to operate these and other components at a lower clock rate. One particular solution has been described in P. K. Hanumolu, et al., "A 1.6 Gbps Digital CDR," *IEEE Custom Integrated Circuits Conference* (2006) 603-606, which employs demultiplexing and majority vote circuits. However, the demultiplexing and majority vote circuits still require many latches and adders, which may occupy a larger area and dissipate more power than the embodiments described herein.

Figure 3:
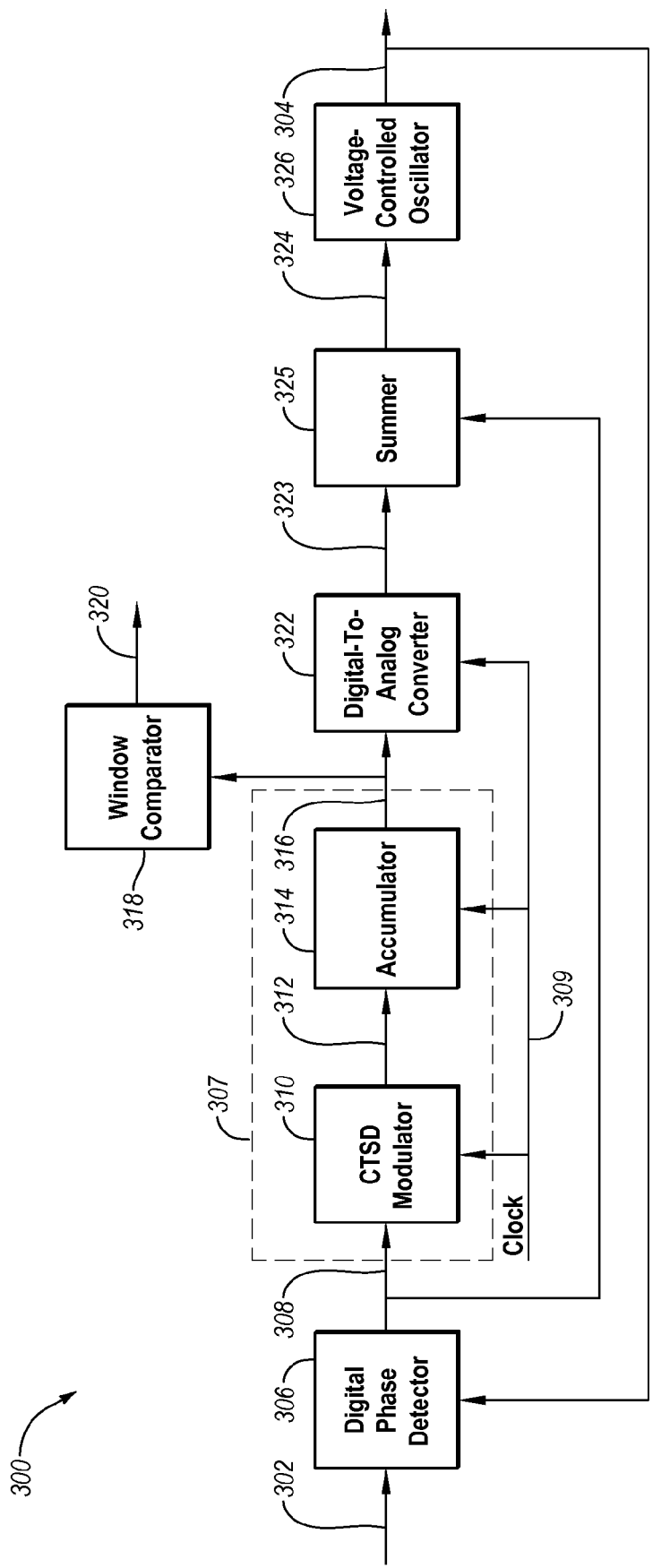
FIG. 3 illustrates an improved phase-locked loop.

FIG. 3 illustrates an improved phase-locked loop 300 including a phase-to-digital converter comprising a digital phase detector 306 and a continuous-time sigma-delta (CTSD) modulator 310 in which the CTSD modulator 310 acts as a decimator. A decimator is a digital function where the digital input is digitally filtered and down-sampled. An example of a conventional first-order CTSD modulator is shown in Block 415 of FIG. 4A.

The phase-locked loop 300 may receive a reference signal 302 and output a source signal 304. In some embodiments, the source signal 304 may include a recovered clock of the reference signal 302. The phase-locked loop 300 may offer several advantages over the conventional analog and digital phase locked loops of FIGS. 1 and 2. Advantages of the phase-locked loop 300 may include, but are not limited to, an increased resistance to noise and capacitor piezoelectric effects. The phase-locked loop 300 may eliminate the need for an external loop filter capacitor. The phase-locked loop 300 may also demonstrate decreased power and board space requirements. In contrast to conventional phase-locked loops, the phase-locked loop 300 may be programmed to meet various protocol requirements without changing physical components.

The phase-locked loop 300 may also allow a digital window comparator 318 to be used to determine phase lock. A digital window comparator 318 may permit temperature compensation in the digital domain, which may be preferable to temperature compensation in the analog domain. In applications employing parallel communication transmissions, the advantages of the phase-locked loop 300 may be magnified. The phase-locked loop 300 may demonstrate other advantages not described here. The phase-locked loops described with reference to FIGS. 4A and 4B, as well as the method described with reference to FIG. 5, may also demonstrate the advantages described here, as well as additional advantages.

The phase-locked loop 300 includes a phase-to-digital converter 307. The phase-to-digital converter 307 may include the CTSD modulator 310 and an accumulator 314. In some embodiments, the CTSD modulator 310 may include a first-order sigma-delta modulator. Alternately or additionally, the CTSD modulator 310 may include a second-order or higher order sigma-delta modulator. Alternately or additionally, the CTSD modulator 310 may include a plurality of cascading CTSD modulators. In some embodiments, the cascading CTSD modulators may form a multistage noise shaping structure. The CTSD modulator 310 may function as a decimator.

In the illustrated embodiment, a digital phase detector 306 outputs a correction signal 308 at line rate. For example, the voltage-controlled oscillator 326 may operate at the line rate frequency. In alternate embodiments, the VCO may operate at subrates such as ½, ¼, or ⅛, etc. This digital stream may be filtered by the CTSD modulator 310 and down-sampled by virtue of providing a clock signal 309 to the CTSD modulator 310 much less than the clock used to generate the correction signal 308. In some embodiments, the clock signal 309 can be asynchronous to the voltage-controlled oscillator 326 frequency or the clock signal 309 may be some integer division of the voltage-controlled oscillator 326 frequency.

In some embodiments, the CTSD modulator 310 may input the correction signal 308 and generate a modulated signal 312 based on the correction signal 308. The accumulator 314 may input the modulated signal 312 and the clock signal 309 and output a digital signal 316. In some embodiments, the accumulator 314 may output a digital word as the digital signal 316. In some embodiments, the digital word may be based on a count stored at the accumulator 314. In some embodiments, the digital signal 316 may be converted to an analog signal 323 by the digital-to-analog converter 322, as illustrated in FIG. 3.

Although not required, a summer 325 may sum the analog signal 323 and the correction signal 308 to form an analog control signal 324, as illustrated in FIG. 3. The analog control signal 324 may drive the voltage-controlled oscillator 326 to output the source signal 304. In an example embodiment, if the digital phase detector 306 detects that the reference signal 302 leads the source signal 304, the resulting analog control signal 324 may cause the voltage-controlled oscillator 326 to increase the frequency of the source signal 304. Similarly, if the digital phase detector 306 detects that the source signal 304 leads the reference signal 302, the resulting analog control signal 324 may cause the voltage-controlled oscillator 326 to decrease the frequency of the source signal 304.

The phase-locked loop 300 may include a digital window comparator 318, which may be used to quantify lock condition during frequency acquisition phase and generate a lock signal 320. A window comparator is generally a device that compares a characteristic of a signal to a high threshold and a low threshold. The digital window comparator 318 may indicate whether the phase-locked loop 300 has lost the ability to phase lock. The phase-locked loop 300 may lose the ability to phase lock if the reference frequency is too high or too low. For example, the phase-locked loop 300 may lose the ability to phase lock if the voltage required to produce a particular frequency match is unattainable by the system. The digital window comparator 318 may output a lock signal 320 indicating a warning when the characteristic of the signal is above the high threshold or below the low threshold. The digital window comparator 318 may monitor the digital signal 316 to determine whether the phase-locked loop 300 is able to achieve a phase lock. In some embodiments, the high threshold and low threshold may be based on the maximum and minimum digital signal 316 that can result in achievable voltages being delivered to the voltage-controlled oscillator 326.

Because there is a relationship between the digital signal 316 and the analog control signal 324 provided to the voltage-controlled oscillator 326, window comparison that might be performed on the analog control signal 324 can instead be performed on the digital signal 316. Furthermore, because the center frequency of a voltage-controlled oscillator 326 may have a temperature dependency, the analog control signal 324 voltage for a given frequency may change as a function of temperature. As a result, the reference level for the digital window comparator 318 may be temperature compensated depending on the temperature at the time phase lock is achieved. Temperature dependency can vary among individual voltage-controlled oscillators and thus temperature compensation may need to be changed depending on the particular phase-locked loop. Changing the temperature compensation between particular phase-locked loops can be difficult using analog window comparators. However, changing the temperature compensation in the digital window comparator 318 may be accomplished more easily.

Figure 4A:
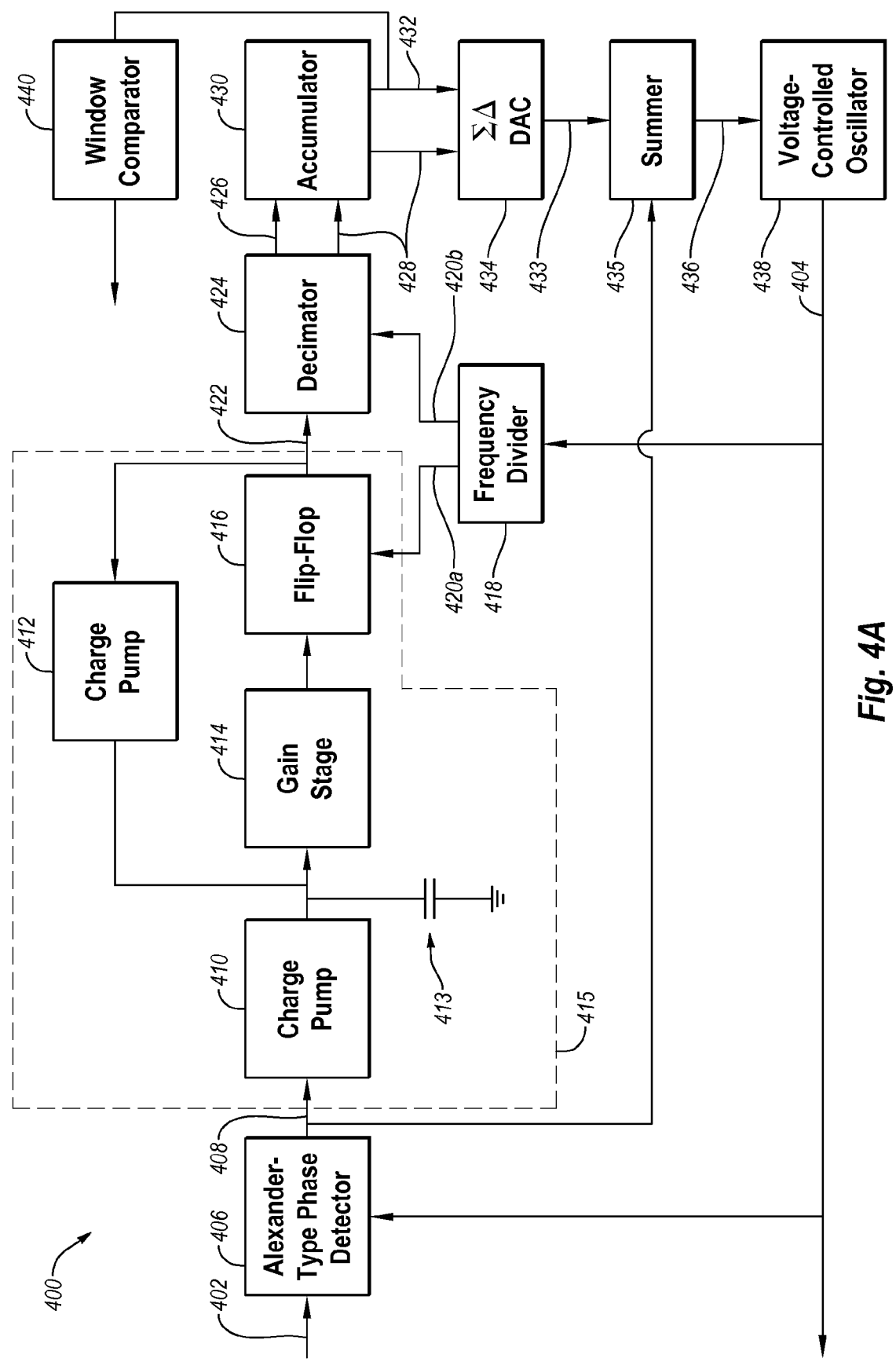
FIG. 4A illustrates an example embodiment of the phase-locked loop of FIG. 3 including a voltage-controlled oscillator.

FIG. 4A illustrates a more specific implementation of a phase-locked loop 400 according to some embodiments. The phase-locked loop 400 may operate in a manner similar to the phase-locked loop 300 described with reference to FIG. 3. The phase-locked loop 400 may input a reference signal 402 and output a source signal 404. In some embodiments, the phase-locked loop 400 may include a binary Alexander-type phase detector 406, also known as a Bang-Bang-type phase detector. The correction signal 408 output by the Alexander-type phase detector 406 may include two output states. For example, the Alexander-type phase detector 406 may include a high-state output and a low-state output. In some embodiments, a signal may be output on the high-state output when the phase of the reference signal 402 leads the phase of the source signal 404. Conversely, a signal may be output on the low-state output when the phase of the source signal 404 leads the phase of the reference signal 402. Since the Alexander-type phase detector 406 is a digital phase detector, the correction signal 408 pulse width may be the same as the source period of oscillation regardless of the phase error between the reference signal 402 and the source signal 404. This may result in a loop such that the phase of the source signal 404 is never quite phase locked to the reference signal 402, but instead dithers between leading and lagging state. In the case of a non-return-to-zero (NRZ) input signal, no signal may be output on the high-state or low-state outputs when there are no transitions in the NRZ reference signal. Put another way, the pulse width of the correction signal 408 may be returned to the mid-level state. In some embodiments, the correction signal 408 pulse may be held at the current state as a result of the phase comparison to the previous input transition.

The phase-locked loop 400 may include a phase-to-digital converter including a CTSD modulator 415. The physical components of the CTSD modulator 415 may be made very compact for a given signal resolution. In some embodiments, high oversampling rates may be used to increase the signal resolution while maintaining compactness of the physical components. The CTSD modulator 415 may include a first charge pump 410, a second charge pump 412, a gain stage 414, and a flip-flop 416. The output of the first charge pump 410 and the second charge pump 412 may be input at a gain stage 414. In some embodiments, the gain may be set by the voltage ratio of the first charge pump 410 to the second charge pump 412. In some embodiments, the CTSD modulator 415 may include a capacitor 413 after the first charge pump 410 for anti-aliasing. In some embodiments, the capacitor 413 may have a capacitance in the range of 2 picofarads to 10 picofarads. Alternately, the capacitor 413 may have a difference capacitance. The flip-flop 416 may input the output of the gain stage 414 and a clock 420a generated by passing the source signal 404 through a frequency divider 418. In some embodiments, the frequency divider 418 may divide the clock 420a by 4 or by 8. Alternately, the frequency divider 418 may divide the clock 420a by a different amount.

In some embodiments, the gain stage 414 and clock 420a may mitigate metastability that may otherwise occur since the second charge pump 412, on average, keeps the voltage on the capacitor 413 close to the threshold of the flip-flop 416. The flip-flop 416 may output a digital signal 422 with a pulse density proportional to the correction signal 408. In some embodiments, the flip-flop 416 may include two outputs. For example, the flip-flop 416 may include a high-state output and a low-state output.

Since the Alexander-type phase detector 406 outputs a digital correction signal 408 and the Alexander-type phase detector 406 is using data rate clock frequency and the CTSD modulator 415 is running at a divided clock 420a rate, in essence the CTSD modulator 415 is acting like a decimator. Therefore, 410, 412, 413, 414, and 416 can be grouped together and defined as a decimator. In some embodiments, the phase-locked loop 400 may include two or more cascading CTSD modulators with the cascading CTSD modulator using lower clock frequency. In some embodiments, the second cascaded CTSD modulator may include a slower flip-flop that consumes less power than the previous cascaded CTSD modulator.

Optionally, the phase-locked loop 400 may further include a decimator 424 as illustrated in FIG. 4A. In some embodiments, the decimator 424 may input the digital signal 422 and a divided clock 420b. The divided clock 420b may be at a lower frequency than clock 420a. The decimator may output a decimated digital signal 426. In some embodiments, the decimator 424 may also output a decimated clock 428. In some embodiments, the decimated digital signal 426 may include multiple signal outputs. For example, the decimator may include an up output and a down output. The decimated digital signal 426 may have a lower frequency than the digital signal 422. In some embodiments, the decimated digital signal 426 may have the same pulse density as the digital signal 422. In some embodiments, the phase-locked loop 400 may omit the decimator 424.

The decimator 424 may include a frequency divider for decimating the digital signal 422. In some embodiments, the frequency divider may include a toggle divider. In some embodiments, the frequency divider may include a synchronous divider. In some embodiments, another frequency divider may be used. In some embodiments, use of a toggle divider may lower power use of the phase-locked loop 400 compared to use of a synchronous divider. In some embodiments, the frequency divider may divide the signal by 4 or 8. In some embodiments, the frequency divider may divide the signal by another value.

The embodiments described herein may be more efficient in both size and power dissipation than implementations that employ more flip-flops and buffers. For example, the embodiments described herein may be more power efficient and/or more compact than implementations similar to those described in U.S. Pat. No. 7,421,050 to Aziz et al.

In some embodiments, the phase-locked loop 400 may include an accumulator 430. The accumulator 430 may input the decimated digital signal 426 and the decimated clock 428. In some embodiments, the accumulator 430 may include a counter. In some embodiments, the counter may be an 11-, 12-, or 18-bit up-down counter. The depth (the higher number of bits, the deeper the counter) of the accumulator 430 may be equivalent to the external capacitance required in the analog phase-locked loop 100 of FIG. 1. A deeper counter may be equivalent to a larger capacitance. In some embodiments, a 12-bit counter may be included for fiber channel applications. In some embodiments, an 18-bit counter may be included for synchronous optical network (SONET) applications. Alternately, another counter may be used. The filter depth of the counter may be changed during operation, which may allow an effective capacitance of the accumulator 430 to be changed during operation of the phase-locked loop 400. In some embodiments, the counter may preset at roughly half of the maximum count. For example, the counter may preset before the phase-locked loop 400 has received a reference signal 402. In some embodiments, the counter may stop when the count reaches overflow or underflow. For example, the counter may stop when it reaches its maximum or minimum count.

In some embodiments, the accumulator 430 may increment or decrement the count based on the decimated digital signal 426. In embodiments that eliminate the decimator 424, the accumulator 430 may increment or decrement the count based on the digital signal 422. In some embodiments, the accumulator 430 may include multiple signal inputs. For example, the accumulator 430 may include an up input and a down input. In some embodiments, the accumulator 430 may increment the count when a decimated digital signal 426 is received on the up input. In some embodiments, the accumulator 430 may decrement the count when a decimated digital signal 426 is received on the down input. In some embodiments, the accumulator 430 may increment and decrement the count based on a single signal input.

The accumulator 430 may output a digital word 432. In some embodiments, the digital word 432 may be a 10-bit-wide word. In some embodiments, the digital word 432 may include the 10 most significant bits (msb) of the count. The 10-bit word may then be input by a sigma-delta digital-to-analog converter (DAC) 434, which converts the digital word into an analog signal 433. In some embodiments, the 10-bit resolution may translate to a worst-case frequency offset ($\delta F$) of about 800 kHz at a one volt full range and about an 800 MHz per volt gain at the voltage-controlled oscillator 438. In some embodiments, the 10-bit resolution may result in one femtosecond ($\delta F/F^2_{data}$) of phase shift per bit in systems with a data rate ($F_{data}$) of 28 gigabits per second (Gb/s).

In some embodiments, the sigma-delta DAC converter 434 may include a 10-bit digital sigma-delta modulator. In some embodiments, the sigma-delta DAC 434 may be similar to the sigma-delta DAC and filter as described in Texas Instruments Incorporated, *Implementation of 12-bit delta-sigma DAC with MSC12xx controller*, Analog Applications Journal 1Q 2002, 27-32. In some embodiments, the sigma-delta DAC filter may include a filter with a bandwidth of less than 1 MHz. In some embodiments, a filter with another bandwidth may be used. In some embodiments, the filter may also be used to perform gain adjustment and level shifting such that the signal may be compatible with the voltage-controlled oscillator's 438 control port common mode and range. In some embodiments, another type of digital-to-analog converter may be used. In some embodiments, the sigma-delta DAC 434 may convert the digital word 432 to an analog signal 433. In some embodiments, the sigma-delta DAC 434 may convert the digital signal 422 or decimated digital signal 426 to the analog signal 433 when the decimator 424 is omitted from the phase-locked loop 400. In some embodiments, the phase-locked loop 400 may include a summer 435 configured to sum the analog signal 433 and the correction signal to form an analog control signal 436. The analog control signal 436 may have a distinctive voltage level used to control the voltage-controlled oscillator 438.

Figure 4B:
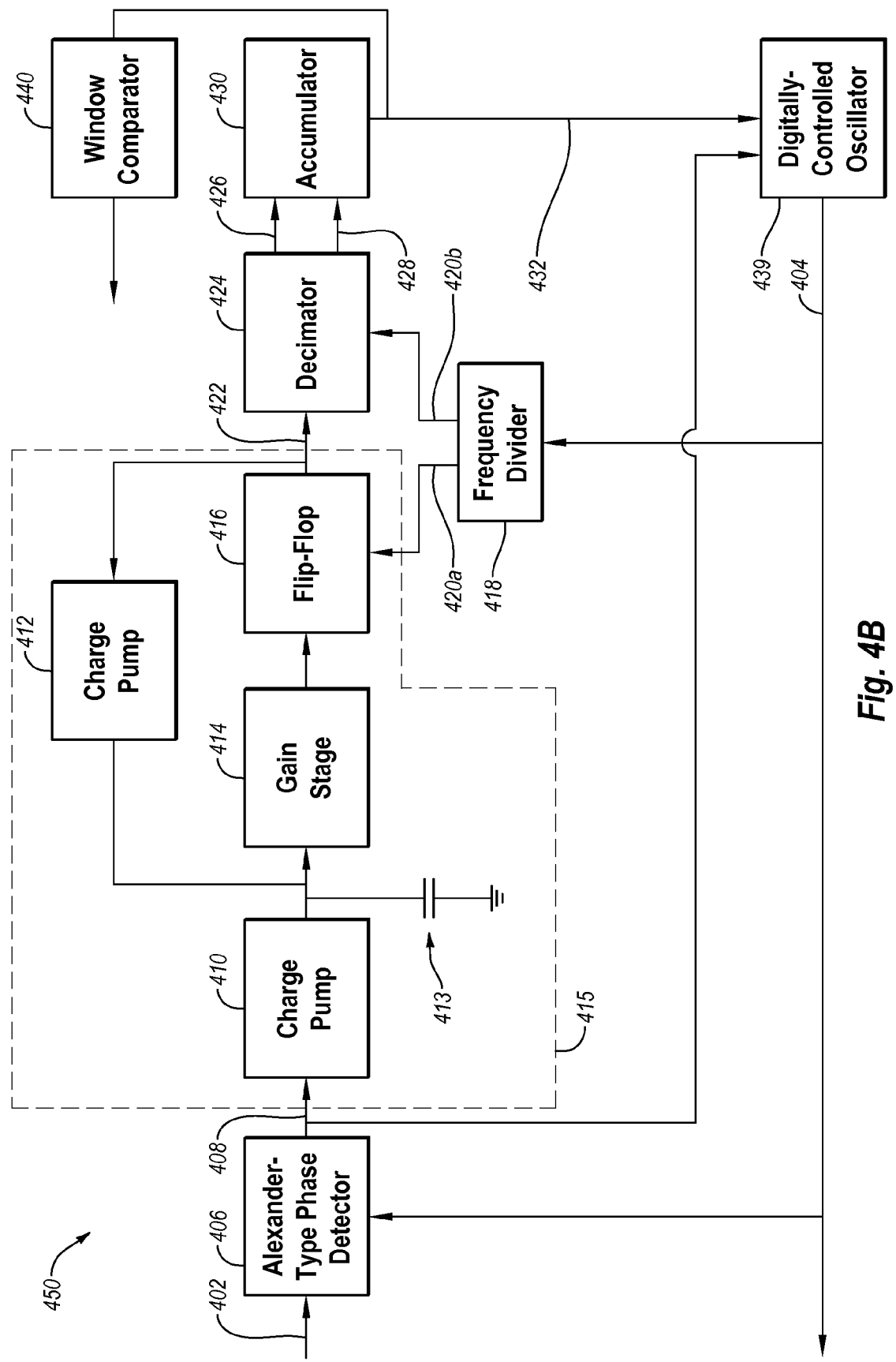
FIG. 4B illustrates an example embodiment of the phase-locked loop of FIG. 3 including a digitally-controlled oscillator.

The voltage-controlled oscillator 438 may generally correspond to the voltage-controlled oscillator 326 described with reference to FIG. 3. The voltage-controlled oscillator 438 may input the analog control signal 436 and output the source signal 404. As illustrated in FIG. 4B, a phase-locked loop 450 may use a digitally-controlled oscillator 439 or a numerically-controlled oscillator in place of the voltage-controlled oscillator 438, summer 435, and sigma-delta DAC 434 of FIG. 4A. In some embodiments, the digital word 432 may drive the digitally-controlled oscillator 439. The digitally-controlled oscillator 439 may also input the correction signal 408 to allow the digitally-controlled oscillator 439 to fine tune the source signal 404.

In some embodiments, the phase-locked loop 400 may include a window comparator 440. The window comparator 440 may generally correspond to the digital window comparator 318 as described with reference to FIG. 3.

In some embodiments, the phase-locked loop may include Current Mode Logic (CML) circuitry and (Complementary Metal-Oxide-Semiconductor) CMOS logic circuitry. In some embodiments, use of CMOS logic may lower power use of the phase-locked loop 400. In some embodiments, the decimator 424 may include a CML-to-CMOS converter and the output of the decimator 424 may include CMOS logic. In some embodiments, the output of the decimator 424, accumulator 430, sigma-delta DAC 434, and/or summer 435 may include CMOS logic. In some embodiments, the decimator 424, accumulator 430, sigma-delta DAC 434, summer 435, and/or voltage-controlled oscillator 438 may include CMOS logic circuitry.

In some embodiments, the phase-locked loop 400 may include an analog compensating zero. In some embodiments, the analog compensating zero may allow the loop to function without the use of a fast digital signal processor (DSP).

Figure 5:
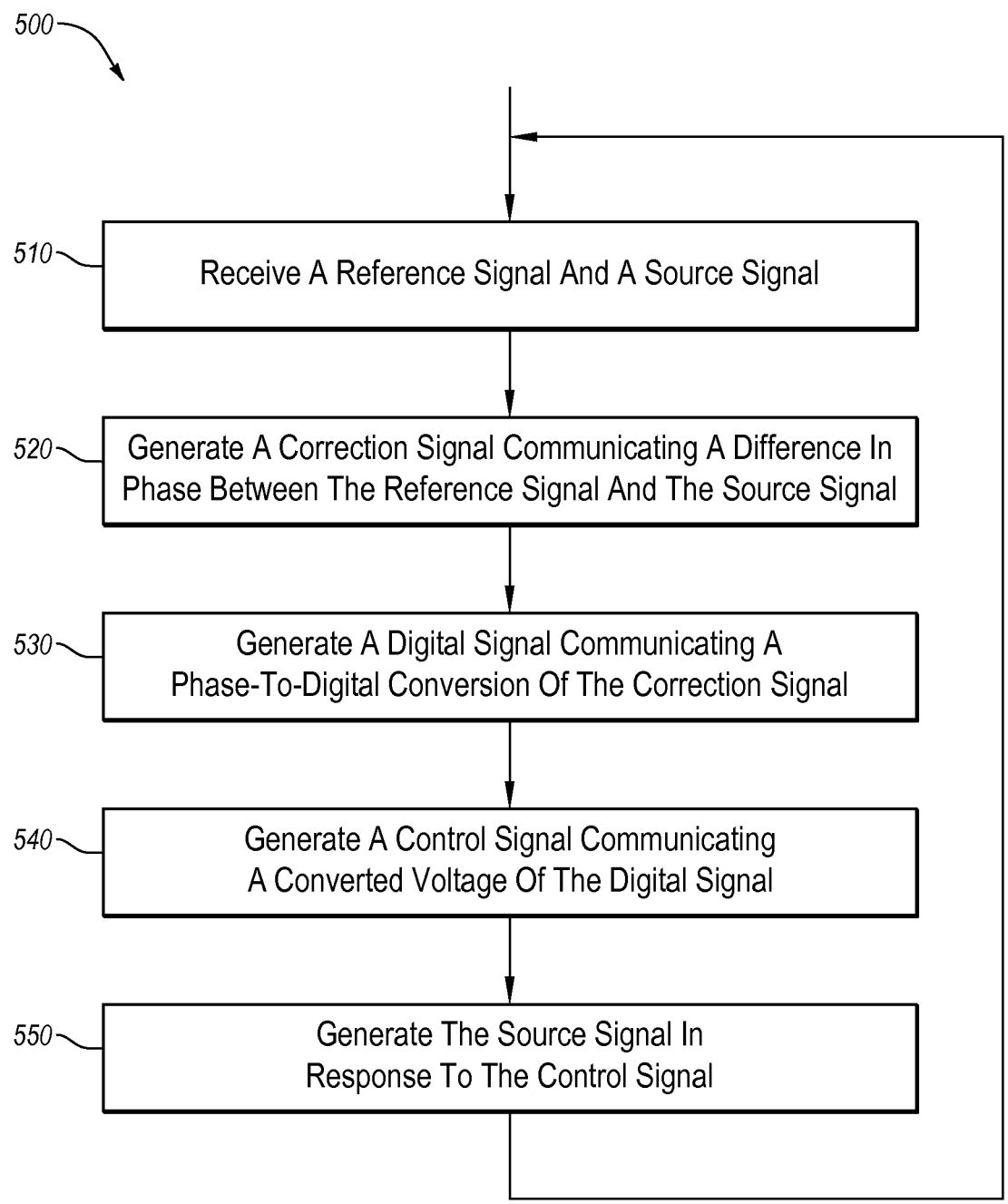
FIG. 5 is a flowchart illustrating a method of generating a source signal from a reference signal.

FIG. 5 illustrates a flowchart of an example method 500 of generating a source signal from a reference signal. The method 500 may be implemented, in some embodiments, by a phase-locked loop as described with relation to FIG. 2, FIG. 3, and/or FIG. 4. The method 500 may begin at block 510 in which the reference signal and the source signal may be received. In block 520, a correction signal communicating a difference in phase between the reference signal and the source signal may be generated. In some embodiments, the correction signal may include a binary correction signal or a digital correction signal. In block 530, a digital signal communicating a phase-to-digital conversion of the correction signal may be generated. In some embodiments, the phase-to-digital conversion may include pulse-density modulation of the correction signal. In some embodiments, the phase-to-digital conversion may include sigma-delta modulation of the correction signal. In block 540, a control signal communicating a converted value of the digital signal may be generated. In block 550, the source signal may be generated in response to the control signal. In some embodiments, the method 500 may repeat. In some embodiments, the method 500 may further include generating a signal that a characteristic of the digital signal is outside of an acceptable range.

The present invention may be embodied in other specific forms without departing from its spirit or essential characteristics. For example, to the extent possible any, or all, of the components disclosed herein may be embodied in software, other hardware, or a combination thereof. The described circuitry can be manufactured by assembly of such circuitry using known circuitry manufacturing and assembly methods. As such, methods for manufacturing or assembling the disclosed embodiments are further disclosed herein. The described embodiments are to be considered in all respects only as illustrative and not restrictive. The scope of the invention is therefore indicated by the appended claims rather than by the foregoing description. All changes which come within the meaning and range of equivalency of the claims are to be embraced within their scope.

What is claimed is:

1. A phase-locked loop circuit for receiving a reference signal including a reference phase and generating a source signal including a source phase related to the reference phase, the phase-locked loop circuit comprising:
   a first circuitry configured to:
      receive the reference signal and the source signal, and
      generate a correction signal for demonstrating a difference in phase between the reference signal and the source signal;
   a second circuitry configured to:
      receive the correction signal, and
      generate a digital signal for demonstrating a phase-to-digital conversion of the correction signal;
   a third circuitry configured to:
      receive the digital signal, and
      generate a control signal for demonstrating a converted value of the digital signal;

a fourth circuitry configured to:
  receive the control signal, and
  generate the source signal in response to the control signal; and
a digital window comparator configured to:
  receive the digital signal,
  compare a characteristic of the digital signal to a low threshold and a high threshold of a range that includes an achievable voltage that the phase-locked loop has an ability to deliver to achieve phase-lock, and
  generate a lock signal for indicating that the characteristic of the digital signal is outside of the range.

2. The phase-locked loop circuit of claim 1, wherein the second circuitry is further configured to decimate the digital signal.

3. The phase-locked loop circuit of claim 1, wherein the second circuitry is further configured to down-sample the digital signal.

4. The phase-locked loop circuit of claim 1, wherein the second circuitry is further configured to decimate and down-sample the digital signal.

5. The phase-locked loop circuit of claim 1, wherein the second circuitry includes a continuous-time sigma-delta modulator.

6. The phase-locked loop circuit of claim 1, wherein:
  the third circuitry includes an accumulator and a digital-to-analog converter, and
  the control signal includes a converted voltage of a digital word generated by the accumulator from the digital signal.

7. The phase-locked loop circuit of claim 1, wherein the first circuitry includes a phase detector configured to generate the binary or digital correction signal.

8. The phase-locked loop circuit of claim 1, wherein:
  the third circuitry includes an accumulator,
  the control signal includes a digital word generated by the accumulator from the digital signal, and
  the fourth circuitry includes a digitally-controlled oscillator configured to generate the source signal in response to the digital word.

9. The phase-locked loop circuit of claim 1, wherein the fourth circuitry includes a voltage-controlled oscillator.

10. A method of generating a source signal from a reference signal including a reference phase, the source signal including a source phase related to the reference phase, the method comprising:
  receiving the reference signal and the source signal;
  generating a correction signal communicating a difference in phase between the reference signal and the source signal;
  generating a digital signal communicating a phase-to-digital conversion of the correction signal;
  generating a control signal communicating a converted value of the digital signal;
  generating the source signal in response to the control signal;
  comparing a characteristic of the digital signal to a low threshold and a high threshold of a range that includes an achievable voltage that the phase-locked loop has an ability to deliver to achieve phase-lock; and
  generating a lock signal for indicating that the characteristic of the digital signal is outside of the range.

11. The method of claim 10, wherein generating the digital signal includes decimating the correction signal.

12. The method of claim 10, wherein generating the digital signal includes down-sampling the correction signal.

13. The method of claim 10, wherein generating the digital signal includes decimating and down-sampling the correction signal.

14. The method of claim 10, wherein the phase-to-digital conversion of the correction signal includes continuous-time sigma-delta modulation of the correction signal.

15. The method of claim 10, wherein the correction signal includes a binary correction signal or a digital correction signal.

16. The method of claim 10, wherein generating the control signal includes digital-to-analog conversion of the digital signal.

17. A phase-locked loop circuit for receiving a reference signal including a reference phase and generating a source signal including a source phase related to the reference phase, the phase-locked loop circuit comprising:
  means for generating a correction signal for communicating a difference in phase between the reference signal and the source signal;
  means for generating a digital signal for communicating phase-to-digital conversion of the correction signal;
  means for generating a control signal for communicating a converted value of the digital signal;
  means for generating the source signal in response to the control signal;
  means for comparing a characteristic of the digital signal to a low threshold and a high threshold of a range that includes an achievable voltage that the phase-locked loop has an ability to deliver to achieve phase-lock; and
  means for generating a signal for indicating that the characteristic of the digital signal is outside of the range.

* * * * *